United States Patent
Inazuki et al.

(10) Patent No.: US 9,651,858 B2
(45) Date of Patent: May 16, 2017

(54) BINARY PHOTOMASK BLANK, PREPARATION THEREOF, AND PREPARATION OF BINARY PHOTOMASK

(71) Applicant: SHIN-ETSU CHEMICAL CO., LTD., Tokyo (JP)

(72) Inventors: Yukio Inazuki, Joetsu (JP); Takuro Kosaka, Joetsu (JP); Kazuhiro Nishikawa, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 181 days.

(21) Appl. No.: 14/799,358

(22) Filed: Jul. 14, 2015

(65) Prior Publication Data
US 2016/0018729 A1    Jan. 21, 2016

(30) Foreign Application Priority Data

Jul. 15, 2014 (JP) ................. 2014-145039
May 22, 2015 (JP) ................. 2015-104399

(51) Int. Cl.
*G03F 1/50* (2012.01)
*G03F 1/46* (2012.01)
*G03F 1/54* (2012.01)
*G03F 1/58* (2012.01)
*G03F 1/60* (2012.01)
*G03F 1/80* (2012.01)

(52) U.S. Cl.
CPC ............. *G03F 1/50* (2013.01); *G03F 1/46* (2013.01); *G03F 1/54* (2013.01); *G03F 1/58* (2013.01); *G03F 1/60* (2013.01); *G03F 1/80* (2013.01)

(58) Field of Classification Search
CPC ....... G03F 1/50; G03F 1/46; G03F 1/54; G03F 1/58; G03F 1/60; G03F 1/80
USPC .......................................................... 430/5
See application file for complete search history.

(56) References Cited

U.S. PATENT DOCUMENTS

| 5,474,864 | A | 12/1995 | Isao et al. |
| 7,691,546 | B2 | 4/2010 | Yoshikawa et al. |
| 2007/0212619 | A1 | 9/2007 | Yoshikawa et al. |
| 2012/0082924 | A1 | 4/2012 | Kominato et al. |

FOREIGN PATENT DOCUMENTS

| EP | 1 801 647 A1 | 6/2007 |
| EP | 1 832 926 A2 | 9/2007 |
| JP | 7-140635 A | 6/1995 |
| JP | 2003-195479 A | 7/2003 |
| JP | 2006-78807 A | 3/2006 |
| JP | 2007-241060 A | 9/2007 |
| WO | WO 2010/113787 A | 10/2010 |

OTHER PUBLICATIONS

Extended European Search Report issued May 27, 2016, in European Patent Application No. 15175384.5.

*Primary Examiner* — Christopher Young
(74) *Attorney, Agent, or Firm* — Birch, Stewart, Kolasch & Birch, LLP

(57) ABSTRACT

A binary photomask blank has a light-shielding film on a transparent substrate, the light-shielding film composed mainly of transition metal M and Si, or M, Si and N, and having an optical density of at least 3.0. The light-shielding film includes a layer containing M, Si and N so as to meet the formula: $B \leq 0.68 \times A + 0.23$ wherein A is an atomic ratio M/Si and B is an atomic ratio N/Si, and has a thickness of up to 47 nm. The binary photomask blank has a thin light-shielding film capable of fully shielding exposure light.

13 Claims, 5 Drawing Sheets

BINARY PHOTOMASK BLANK, PREPARATION THEREOF, AND PREPARATION OF BINARY PHOTOMASK

CROSS-REFERENCE TO RELATED APPLICATION

This non-provisional application claims priority under 35 U.S.C. §119(a) on Patent Application Nos. 2014-145039 and 2015-104399 filed in Japan on Jul. 15, 2014 and May 22, 2015, respectively, the entire contents of which are hereby incorporated by reference.

TECHNICAL FIELD

This invention relates to a binary photomask blank, a method for preparing the binary photomask blank, and a method for preparing a binary photomask from the binary photomask blank. The binary photomask is used in the microfabrication of semiconductor integrated circuits, charge coupled devices (CCD), liquid crystal display (LCD) color filters, magnetic heads or the like, typically by ArF excimer laser lithography.

BACKGROUND ART

In the recent semiconductor processing technology, a challenge to higher integration of large-scale integrated circuits places an increasing demand for miniaturization of circuit patterns. There are increasing demands for further reduction in size of circuit-constructing wiring patterns and for miniaturization of contact hole patterns for cell-constructing inter-layer connections. As a consequence, in the manufacture of circuit pattern-written photomasks for use in the photolithography of forming such wiring patterns and contact hole patterns, a technique capable of accurately writing finer circuit patterns is needed to meet the miniaturization demand.

In order to form a higher accuracy photomask pattern on a photomask substrate, it is of first priority to form a high accuracy resist pattern on a photomask blank. Since the photolithography carries out reduction projection in actually processing semiconductor substrates, the photomask pattern has a size of about 4 times the actually necessary pattern size, but an accuracy which is not loosened accordingly. The photomask serving as an original is rather required to have an accuracy which is higher than the pattern accuracy following exposure.

Further, in the currently prevailing lithography, a circuit pattern to be written has a size far smaller than the wavelength of light used. If a photomask pattern which is a mere 4-time magnification of the circuit feature is used, a shape corresponding to the photomask pattern is not transferred to the resist film due to influences such as optical interference occurring in the actual photolithography operation. To mitigate these influences, in some cases, the photomask pattern must be designed to a shape which is more complex than the actual circuit pattern, i.e., a shape to which the so-called optical proximity correction (OPC) is applied. Thus, at the present, the lithography technology for obtaining photomask patterns also requires a higher accuracy processing method. The lithographic performance is sometimes represented by a maximum resolution. As to the resolution limit, the lithography involved in the photomask processing step is required to have a maximum resolution accuracy which is equal to or greater than the resolution limit necessary for the photolithography used in a semiconductor processing step using a photomask.

A photomask pattern is generally formed by forming a photoresist film on a photomask blank having a light-shielding film on a transparent substrate, writing a pattern using electron beam, and developing to form a resist pattern. Using the resulting resist pattern as an etch mask, the light-shielding film is etched into a light-shield pattern. In an attempt to miniaturize the light-shield pattern, if processing is carried out while maintaining the thickness of the resist film at the same level as in the art prior to the miniaturization, the ratio of film thickness to pattern width, known as aspect ratio, becomes higher. As a result, the resist pattern profile is degraded, preventing effective pattern transfer, and in some cases, there occurs resist pattern collapse or stripping. Therefore, the thickness of resist film must be reduced to enable miniaturization.

As to the light-shielding film material to be etched through the resist pattern as etch mask, a number of materials are known in the art. Among others, chromium compound films are used in practice because many teachings about etching are available and their processing has been established as the standard process. For example, a photomask blank having a light-shielding film composed of a chromium compound suited for ArF excimer laser lithography is disclosed in JP-A 2003-195479. Specifically a chromium compound film having a thickness of 50 to 77 nm is described.

A typical dry etching process for chromium base films such as chromium compound films is oxygen-containing chlorine gas dry etching, which has a certain etching ability relative to organic film. Thus, when etching is conducted through a thinner resist film in order to transfer a finer size pattern for the above-described reason, the resist film can be damaged during etching. It is then difficult to transfer the resist pattern accurately. To meet both the requirements of miniaturization and accuracy, it becomes necessary to investigate the light-shielding material again so as to facilitate the processing of light-shielding film, rather than the current trend relying solely on resist performance improvement.

For example, JP-A 2006-78807 discloses a light-shielding film including at least one layer of a material mainly containing silicon and a transition metal wherein an atomic ratio of silicon:metal is 4-15:1. The light-shielding film has improved light shielding function and ease of processing and is suited for the ArF lithography. Also JP-A 2007-241060 discloses a photomask blank comprising a light-shielding film containing silicon and a transition metal and a thin film of chromium base material as a hard mask film, with the advantage of high accuracy processing.

CITATION LIST

Patent Document 1: JP-A 2003-195479
Patent Document 2: JP-A 2006-078807 (U.S. Pat. No. 7,691,546, EP 1801647)
Patent Document 3: JP-A 2007-241060 (US 2007212619, EP 1832926)
Patent Document 4: JP-A H07-140635

SUMMARY OF INVENTION

As described above, a light-shielding film which can be processed under mild conditions that cause less damages to the resist pattern is necessary in order to form a finer size pattern accurately. In the case of a photomask blank comprising a light-shielding film containing silicon and a transition metal as elements for providing a transmittance reducing function and optionally low atomic weight elements such as nitrogen and oxygen and a chromium base hard mask film, proposed in JP-A 2007-241060, one effective means for reducing the load to the resist is by reducing the thickness of the light-shielding film itself as well as the thickness of the hard mask film. In this case, particularly on the light-shielding film side, the concentration of low atomic weight elements (e.g., nitrogen and oxygen) added to the material is minimized in order to derive a better light shielding effect from a thin film. That is, a so-called highly metallic film is used as the light-shielding film.

While a photomask blank from which a photomask is manufactured is provided with optical functional films such as a light-shielding film and a phase shift film, these optical films must meet the physical properties necessary for the photomask, especially optical properties and chemical stability. The optical films must also be improved in processability in order to facilitate formation of a high accuracy mask pattern. With the advances of the photolithography toward the size reduction of the desired pattern, the mask is also required to have a pattern of finer size and higher accuracy.

When a fine size, high accuracy pattern is formed from an inorganic material film, the thickness of the inorganic material film to be processed is preferably reduced as long as necessary physical properties are maintained. This is because the thickness of a resist film must be relatively thin in order that the resist pattern used upon processing have a higher accuracy, as mentioned above, and because in the step of pattern transfer to the inorganic material film by a dry etching or similar technique using the resist pattern resulting from the resist film, the accuracy of pattern transfer can be increased by minimizing the load on the resist film.

Particularly when a photomask blank is processed into a photomask capable of complying with formation of an exposure pattern having a line width of 60 nm or less, the thickness of the light-shielding film must be reduced in order to prevent the light-shielding film from pattern collapse during the photomask preparation process, especially the cleaning step. To reduce the thickness of the light-shielding film is also required for the purpose of reducing the three-dimensional effect during pattern design on the photomask.

Since the light-shielding film of a compound containing silicon and a transition metal as an element for providing a transmittance damping function, described in Patent Document 3, has a high shielding ability to light having a wavelength of up to 200 nm and can be etched under fluorine base dry etching conditions, a relatively preferred etching ratio relative to organic material used as the resist material during lithography is established. Even on use of such material, reducing the thickness of the light-shielding film while maintaining light-shielding function is still effective in securing a process accuracy. In an attempt to produce a binary photomask with a high accuracy, for example, further reducing the thickness of the light-shielding film is desirable. In order that the light-shielding film is reduced in thickness without sacrificing light-shielding function, a more metallic film must be formed by reducing the content of light elements such as nitrogen and oxygen for thereby increasing the absorption coefficient of the film with respect to exposure light.

An object of the invention is to provide a binary photomask blank comprising a light-shielding film which is reduced in thickness while maintaining necessary light-shielding function, a method for preparing the binary photomask blank, and a method for preparing a binary photomask from the binary photomask blank.

The invention relates to a binary photomask blank comprising a transparent substrate and a light-shielding film thereon, the light-shielding film composed mainly of a transition metal M and silicon Si, or a transition metal M, silicon Si and nitrogen N and having an optical density of at least 3.0. The inventors have found that the object is attained when the light-shielding film has a thickness below a certain level and includes a layer whose composition meets a certain relationship of transition metal and nitrogen to silicon. Specifically, the light-shielding film has a thickness of up to 47 nm and includes a layer of a transition metal-silicon-nitrogen composition meeting the formula (1):

$$B \leq 0.68 \times A + 0.23 \qquad (1),$$

or the light-shielding film has a thickness of up to 43 nm and includes a layer of a transition metal-silicon-nitrogen composition meeting the formula (2):

$$B \leq 1.19 \times A - 0.19 \qquad (2),$$

or the light-shielding film has a thickness of up to 41 nm and includes a layer of a transition metal-silicon-nitrogen composition meeting the formula (3):

$$B \leq 2.12 \times A - 0.70 \qquad (3)$$

wherein A is an atomic ratio of M/Si and B is an atomic ratio of N/Si. The light-shielding film consists of a single layer of the specific composition or a plurality of layers including a layer of the specific composition. With this construction, there is obtained a binary photomask blank having a thinner light-shielding film having necessary light-shielding function. The above formula is applicable to the design of a composition of constituent elements. Then the composition of constituent elements, especially transition metal, silicon and nitrogen, necessary to form a thinner light-shielding film may be effectively designed in accordance with a particular film thickness.

The invention provides a binary photomask blank, a method for preparing the same, and a method for preparing a binary photomask, as defined below.

[1] A binary photomask blank comprising a transparent substrate and a light-shielding film thereon, the light-shielding film composed mainly of a transition metal M and silicon Si, or a transition metal M, silicon Si and nitrogen N, consisting of one or more layers, and having an optical density of at least 3.0, wherein the light-shielding film includes a layer of a transition metal-silicon-nitrogen composition meeting the formula (1):

$$B \leq 0.68 \times A + 0.23 \qquad (1)$$

wherein A is an atomic ratio of M to Si and B is an atomic ratio of N to Si, and has a thickness of up to 47 nm.

[2] A binary photomask blank comprising a transparent substrate and a light-shielding film thereon, the light-shielding film composed mainly of a transition metal M and silicon Si, or a transition metal M, silicon Si and nitrogen N, consisting of one or more layers, and having an optical density of at least 3.0, wherein the light-shielding film includes a layer of a transition metal-silicon-nitrogen composition meeting the formula (2):

$$B \leq 1.19 \times A - 0.19 \qquad (2)$$

wherein A is an atomic ratio of M to Si and B is an atomic ratio of N to Si, and has a thickness of up to 43 nm.

[3] A binary photomask blank comprising a transparent substrate and a light-shielding film thereon, the light-shielding film composed mainly of a transition metal M and silicon Si, or a transition metal M, silicon Si and nitrogen N, consisting of one or more layers, and having an optical density of at least 3.0, wherein
the light-shielding film includes a layer of a transition metal-silicon-nitrogen composition meeting the formula (3):

$$B \le 2.12 \times A - 0.70 \tag{3}$$

wherein A is an atomic ratio of M to Si and B is an atomic ratio of N to Si, and has a thickness of up to 41 nm.

[4] The binary photomask blank of any one of [1] to [3] wherein the transition metal is molybdenum.

[5] The binary photomask blank of any one of [1] to [3], further comprising a hard mask film on the light-shielding film, the hard mask film being formed of a material having etch resistance when the light-shielding film is etched.

[6] The binary photomask blank of [5] wherein the transition metal is molybdenum and the hard mask film contains chromium.

[7] A method for preparing a binary photomask comprising the steps of forming a resist film having a thickness of up to 150 nm on the light-shielding film of the binary photomask blank of any one of [1] to [4], processing the resist film to form an etch mask pattern thereof, processing the light-shielding film to form a photomask pattern thereof using the etch mask pattern of resist film, and removing the etch mask pattern of resist film.

[8] A method for preparing a binary photomask comprising the steps of forming a resist film having a thickness of up to 150 nm on the hard mask film of the binary photomask blank of [5] or [6], processing the resist film to form an etch mask pattern thereof, processing the hard mask film to form an etch mask pattern thereof using the etch mask pattern of resist film, processing the light-shielding film to form a photomask pattern thereof using the etch mask pattern of hard mask film, and removing the etch mask pattern of resist film and the etch mask pattern of hard mask film.

[9] A method for preparing a binary photomask blank comprising a transparent substrate and a light-shielding film thereon, the light-shielding film composed mainly of a transition metal M and silicon Si, or a transition metal M, silicon Si and nitrogen N, consisting of one or more layers, and having an optical density of at least 3.0,
the method comprising the step of forming the light-shielding film such that it may include a layer of a transition metal-silicon-nitrogen composition meeting the formula (1):

$$B \le 0.68 \times A + 0.23 \tag{1}$$

wherein A is an atomic ratio of M to Si and B is an atomic ratio of N to Si, and it may have a thickness of up to 47 nm.

[10] A method for preparing a binary photomask blank comprising a transparent substrate and a light-shielding film thereon, the light-shielding film composed mainly of a transition metal M and silicon Si, or a transition metal M, silicon Si and nitrogen N, consisting of one or more layers, and having an optical density of at least 3.0,
the method comprising the step of forming the light-shielding film such that it may include a layer of a transition metal-silicon-nitrogen composition meeting the formula (2):

$$B \le 1.19 \times A - 0.19 \tag{2}$$

wherein A is an atomic ratio of M to Si and B is an atomic ratio of N to Si, and it may have a thickness of up to 43 nm.

[11] A method for preparing a binary photomask blank comprising a transparent substrate and a light-shielding film thereon, the light-shielding film composed mainly of a transition metal M and silicon Si, or a transition metal M, silicon Si and nitrogen N, consisting of one or more layers, and having an optical density of at least 3.0, wherein
the method comprising the step of forming the light-shielding film such that it may include a layer of a transition metal-silicon-nitrogen composition meeting the formula (3):

$$B \le 2.12 \times A - 0.70 \tag{3}$$

wherein A is an atomic ratio of M to Si and B is an atomic ratio of N to Si, and it may have a thickness of up to 41 nm.

[12] The method of any one of [9] to [11] wherein the transition metal is molybdenum.

Advantageous Effects of Invention

The binary photomask blank of the invention has a thinner light-shielding film capable of fully shielding exposure light. When the binary photomask blank is processed into a binary photomask, the resulting photomask has a high accuracy because a resist film of reduced thickness may be used. When the binary photomask blank having a hard mask film of chromium base material is processed into a binary photomask, the resulting photomask has a higher accuracy.

DESCRIPTION OF EMBODIMENTS

The binary photomask blank of the invention is a blank from which a binary photomask including two regions, light-transmissive and light-shielding regions is manufactured. It has a light-shielding film having an optical density of at least 3.0 at wavelength 193 nm on a transparent substrate such as a quartz substrate. An area where the light-shielding film is removed and only the transparent substrate is present becomes the light-transmissive region of the binary photomask while an area where the light-shielding film is present or left on the transparent substrate becomes the light-shielding region. Since this light-shielding film is intended for the binary photomask, it should have an optical density of at least 3.0 and preferably up to 3.5. The light-shielding film of a specific composition to be described later ensures the desired light-shielding function even when the film thickness is no more than 47 nm, specifically no more than 43 nm, and more specifically no more than 41 nm. It is noted that the (lower limit) thickness of the light-shielding film is at least 10 nm.

Figure 1:
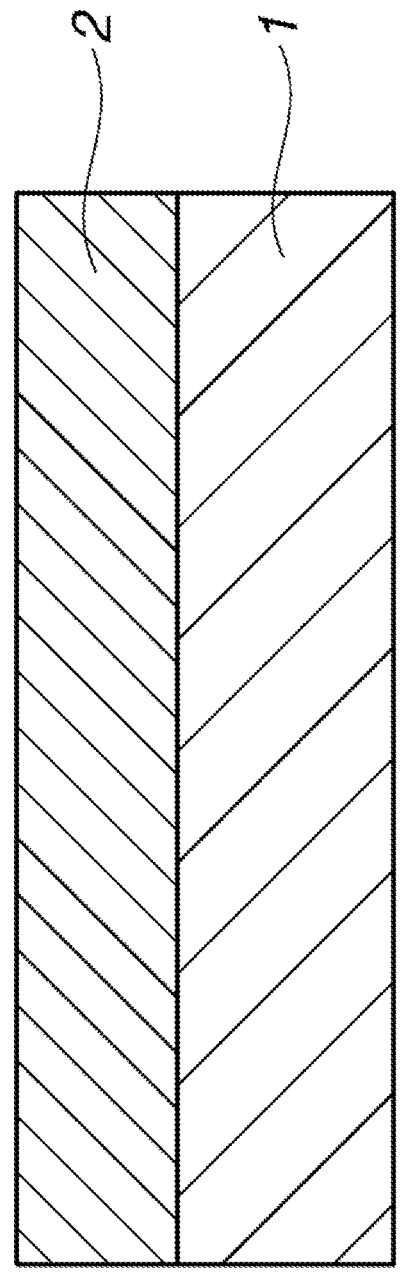
FIG. 1 is a cross-sectional view of a binary photomask blank in a first embodiment of the invention.
Figure 2:
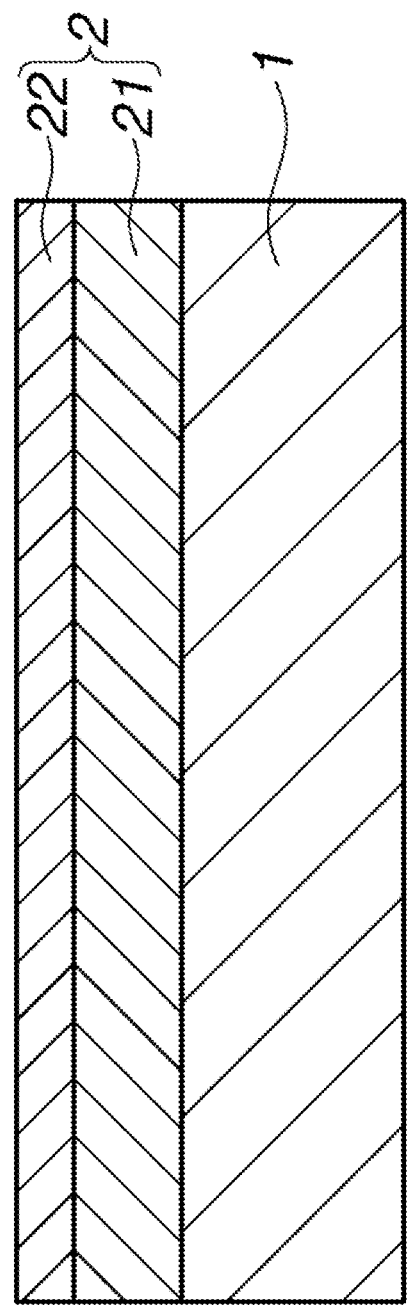
FIG. 2 is a cross-sectional view of a binary photomask blank in a second embodiment of the invention.

The binary photomask blank has a light-shielding film on a transparent substrate while the light-shielding film consists of a single layer or a plurality of layers, specifically two, three or more layers. A first embodiment, binary photomask blank having a light-shielding film of single layer is illustrated in FIG. 1 as comprising a single layer light-shielding film 2 on a transparent substrate 1. A second embodiment, binary photomask blank having a light-shielding film of plural layers, typically a light-shielding film of two layers is illustrated in FIG. 2 as comprising a light-shielding film 2 on a transparent substrate 1, the light-shielding film 2 consisting of an adjacent layer 21 and a remote layer 22. The terms "adjacent" and "remote" are used to mean that layers are disposed adjacent to and remote from the substrate.

The light-shielding film is composed mainly of transition metal M and silicon Si, or transition metal M, silicon Si and nitrogen N. In the embodiment wherein the light-shielding film is a single layer, the layer should be composed mainly of transition metal M and silicon Si, or transition metal M, silicon Si and nitrogen N. In the other embodiment wherein the light-shielding film consists of a plurality of layers, at least one layer should be a layer (referred to as "first layer") composed mainly of transition metal M and silicon Si, or transition metal M, silicon Si and nitrogen N. The thickness of the first layer (total thickness if more than one first layer is included) preferably accounts for at least 50%, more preferably at least 70% of the total thickness of the light-shielding film. On the other hand, another layer (referred to as "second layer") contains transition metal M and silicon Si, and optionally at least one element selected from nitrogen N, oxygen O and carbon C. It is most preferred that all layers be composed mainly of transition metal M, silicon Si and nitrogen N.

In the embodiment wherein the light-shielding film composed mainly of transition metal M and silicon Si, or transition metal M, silicon Si and nitrogen N is a single layer, the layer preferably contains at least 80 at % in total of transition metal M, silicon Si and nitrogen N and specifically 10 to 35 at % of transition metal M, 50 to 80 at % of silicon Si, and at least 0 at %, especially at least 1 at %, and up to 30 at % of nitrogen N. In the embodiment wherein the light-shielding film composed mainly of transition metal M and silicon Si, or transition metal M, silicon Si and nitrogen N consists of a plurality of layers, the first layer composed mainly of transition metal M and silicon Si, or transition metal M, silicon Si and nitrogen N preferably contains at least 80 at % in total of transition metal M, silicon Si and nitrogen N and specifically 10 to 35 at % of transition metal M, 50 to 80 at % of silicon Si, and at least 0 at %, especially at least 1 at %, and up to 30 at % of nitrogen N. The second layer preferably contains at least 35 at % in total of transition metal M and silicon Si and specifically 3 to 35 at % of transition metal M, 30 to 80 at % of silicon Si, and at least 0 at %, especially at least 10 at %, and up to 55 at % of nitrogen N. Although the light-shielding film or constituent layers thereof may further contain oxygen O and/or carbon C as a light element component, it is preferred that the light-shielding film or constituent layers consist of transition metal M and silicon Si, or transition metal M, silicon Si and nitrogen N. The most preferred transition metal is molybdenum Mo.

In the light-shielding film composed mainly of transition metal M, especially molybdenum Mo and silicon Si, or the light-shielding film composed mainly of transition metal M, especially molybdenum Mo, silicon Si and nitrogen N, the optical density per film thickness may be increased by increasing the content of transition metal M, which suggests that the film thickness needed to acquire a necessary optical density, i.e., an optical density of at least 3.0 may be reduced. Also, the optical density per film thickness may be increased by reducing the content of nitrogen N, which suggests that the film thickness needed to acquire a necessary optical density, i.e., an optical density of at least 3.0 may be reduced.

In one embodiment of the binary photomask blank, where the light-shielding film is a single layer, that layer is, and where the light-shielding film consists of a plurality of layers, at least one layer, preferably all layers are constructed such that the composition of transition metal M, silicon Si and nitrogen N meets the formula (1):

$$B \leq 0.68 \times A + 0.23 \tag{1}$$

wherein A is an atomic ratio of M to Si, i.e., M/Si and B is an atomic ratio of N to Si, i.e., N/Si. Then the light-shielding film has a necessary optical density of at least 3.0 even when its thickness (total thickness of light-shielding film) is 47 nm or less.

In another embodiment of the binary photomask blank, where the light-shielding film is a single layer, that layer is, and where the light-shielding film consists of a plurality of layers, at least one layer, preferably all layers are constructed such that the composition of transition metal M, silicon Si and nitrogen N meets the formula (2):

$$B \leq 1.19 \times A - 0.19 \tag{2}$$

wherein A is an atomic ratio M/Si and B is an atomic ratio N/Si. Then the light-shielding film has a necessary optical density of at least 3.0 even when its thickness (total thickness of light-shielding film) is 43 nm or less.

In a further embodiment of the binary photomask blank, where the light-shielding film is a single layer, that layer is, and where the light-shielding film consists of a plurality of layers, at least one layer, preferably all layers are constructed such that the composition of transition metal M, silicon Si and nitrogen N meets the formula (3):

$$B \leq 2.12 \times A - 0.70 \tag{3}$$

wherein A is an atomic ratio M/Si and B is an atomic ratio N/Si. Then the light-shielding film has a necessary optical density of at least 3.0 even when its thickness (total thickness of light-shielding film) is 41 nm or less.

Now that the composition of the layer(s) included in the light-shielding film and the thickness of the light-shielding film are selected as above, there is obtained a binary photomask blank having a light-shielding film which is thin and provides necessary light-shielding function. When the above formula is applied to the design of a composition of constituent elements, it is possible to effectively design the composition of constituent elements, especially transition metal, silicon and nitrogen, necessary to form a thinner light-shielding film, in accordance with a particular film thickness. In any of formulae (1) to (3), A (=M/Si) preferably has a value of 0.1 to 0.6, especially 0.1 to 0.5, and B (=N/Si) preferably has a value of 0 to 0.5. In a further embodiment, the light-shielding film consists of a plurality of layers, one of which may be a layer having antireflection function (antireflective layer).

In forming a light-shielding film of a photomask blank, a sputtering technique, especially reactive sputtering is commonly used. In the practice of the invention, the light-shielding film is preferably deposited by sputtering. The ratio (atomic ratio) of transition metal M to silicon Si in the light-shielding film or constituent layers thereof to be deposited may be adjusted, if a mixed M-Si target is used alone, by controlling the M/Si ratio of the target. If a M target and a Si target are used, the ratio of M/Si in the light-shielding film or layer may be adjusted by controlling the proportion of powers applied to the targets during deposition. The ratio of M/Si may be adjusted otherwise, for example, by using two or more M-Si targets having different compositions, using a M-Si target and a Si target, and controlling the proportion of powers applied to different targets during deposition.

The ratio (atomic ratio) of nitrogen N to silicon Si in the light-shielding film or constituent layers thereof to be deposited is generally adjusted by introducing N-containing gas such as $N_2$ gas during deposition so that the light-shielding film being deposited may contain N. Specifically, the ratio of N/Si may be adjusted by controlling the amount of N fed during deposition. The amount of N may also be adjusted by using a target containing nitrogen N. An inert gas such as Ar gas may be added to the sputtering gas. The sputtering pressure is typically 0.02 to 0.5 Pa.

Figure 3:
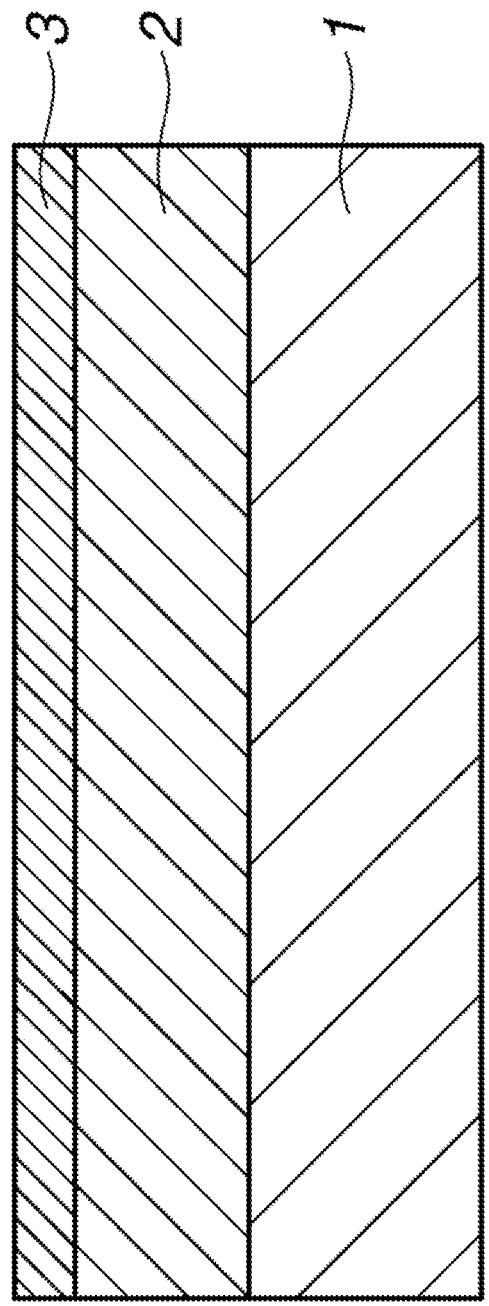
FIG. 3 is a cross-sectional view of a binary photomask blank in a third embodiment of the invention.
Figure 4:
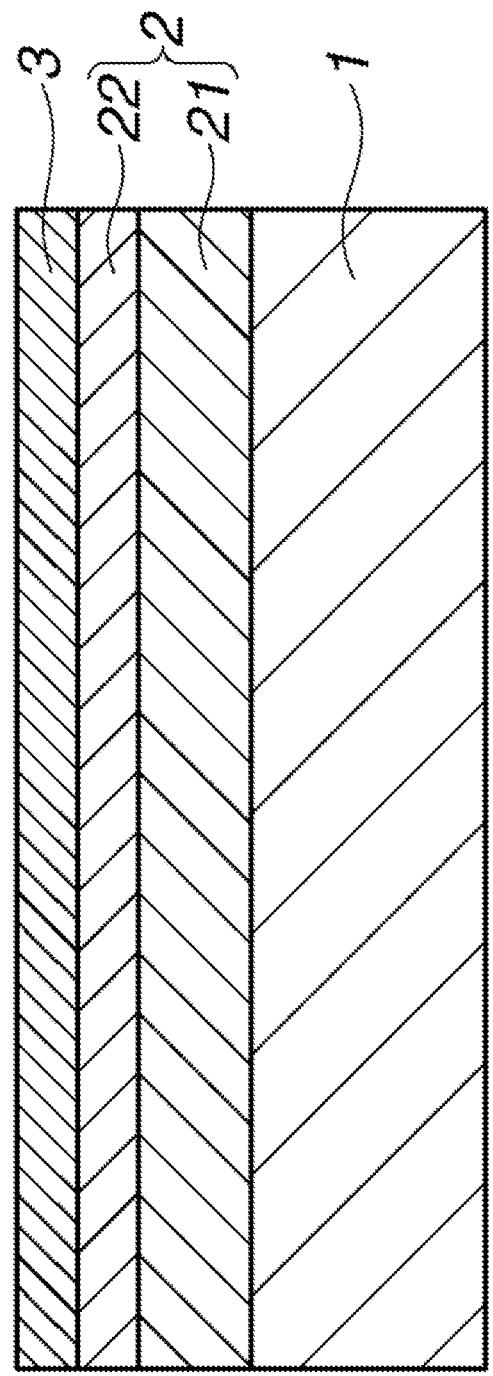
FIG. 4 is a cross-sectional view of a binary photomask blank in a fourth embodiment of the invention.

In the binary photomask blank, an antireflective film may be formed on the light-shielding film. The antireflective film used herein is preferably of a similar composition having an increased N content or having oxygen O added thereto to make the film more transparent. Also in the binary photomask blank, a hard mask film may be formed on the light-shielding film, the hard mask film being formed of a material having etch resistance when the light-shielding film is etched, that is, a material having etch mask function. A third embodiment of the binary photomask blank having a light-shielding film of single layer is shown in FIG. 3 as comprising a transparent substrate 1, a light-shielding film 2 of single layer on the substrate 1, and an etch mask film 3 on the light-shielding film 2. A fourth embodiment of the binary photomask blank having a light-shielding film of plural layers (typically two layers) is shown in FIG. 4 as comprising a transparent substrate 1, a light-shielding film 2 consisting of an adjacent layer 21 and a remote layer 22 on the substrate 1, and an etch mask film 3 on the light-shielding film 2.

Particularly when the transition metal in the light-shielding film is molybdenum, the hard mask film is preferably formed of any of chromium base materials which are commonly used as the hard mask material, for example, metallic chromium, or chromium compounds containing chromium and one or more light elements selected from oxygen, nitrogen and carbon.

The hard mask film of chromium base material is described in Patent Document 3, for example. For enabling high accuracy processing of the light-shielding film, it is necessary that the hard mask film itself can be high accuracy processed. To this end, the hard mask film preferably has a thickness of 1 nm to 10 nm and a composition consisting essentially of 50 to 100 atom %, more preferably 60 to 95 atom % of chromium, 0 to 50 atom %, more preferably 0 to 30 atom % of oxygen, 0 to 50 atom %, more preferably 5 to 40 atom % of nitrogen, and 0 to 20 atom, more preferably 0 to 10 atom % of carbon.

Like the light-shielding film, the hard mask film is preferably deposited by sputtering. The deposition may be by sputtering a chromium target with argon gas alone, or reactive sputtering with a reactive gas such as nitrogen or nitrogen oxide alone, or a mixture of a reactive gas such as nitrogen or nitrogen oxide and an inert gas such as argon, as described in Patent Document 4, for example. The flow rate of sputtering gas may be adjusted in accordance with the desired film properties. For example, the flow rate may be set constant throughout the deposition process or varied in accordance with the desired composition such that the oxygen and/or nitrogen content may vary in thickness direction of the film.

The binary photomask blank of the invention is best suited in manufacturing a binary photomask for use in the ArF lithography, i.e., exposure to ArF excimer laser light of wavelength 193 nm.

A binary photomask may be manufactured from the binary photomask blank of the invention by forming a resist film on the outermost surface, light-shielding film, or antireflective film or hard mask film, if any, processing the resist film to form a resist pattern thereof, etching the underlying film with the resist pattern serving as an etch mask pattern, for thereby forming a photomask pattern or etch mask pattern of the underlying film, and stripping the etch mask pattern. The binary photomask blank ensures that the light-shielding film is patterned at a high accuracy even when the resist film is very thin, specifically has a thickness of up to 150 nm, more specifically 50 to 120 nm.

Specifically, where a hard mask film is not formed, a binary photomask may be prepared from the binary photomask blank by forming a resist film having a thickness of up to 150 nm on the light-shielding film (or on the antireflective film if it is separately formed on the light-shielding film) of the binary photomask blank, processing the resist film to form an etch mask pattern thereof, processing the light-shielding film (or the antireflective film, if any, and the light-shielding film) to form a photomask pattern thereof using the etch mask pattern of resist film, and removing the etch mask pattern of resist film.

Where a hard mask film is formed, a binary photomask may be prepared from the binary photomask blank by forming a resist film having a thickness of up to 150 nm on the hard mask film, processing the resist film to form an etch mask pattern thereof, processing the hard mask film to form an etch mask pattern thereof using the etch mask pattern of resist film, processing the light-shielding film (or the antireflective film if it is separately formed on the light-shielding film, and the light-shielding film) to form a photomask pattern thereof using the etch mask pattern of hard mask film, and removing the etch mask pattern of resist film and the etch mask pattern of hard mask film.

EXAMPLE

Experiment and Examples are given below for further illustrating the invention although the invention is not limited thereto.

Experiment 1

A film of MoSiN was deposited on a quartz substrate by a sputtering technique using silicon (Si) and molybdenum silicide (MoSi) targets, and argon and nitrogen gases as sputtering gas. While the power applied to the MoSi target, the power applied to the Si target, the flow rate of argon gas, and the flow rate of nitrogen gas were controlled, six films of different MoSiN composition were deposited to such thickness that they might have an optical density of 3.0. The composition of Mo, Si and N was measured by X-ray photoelectron spectroscopy (XPS). From the composition determined for each film, a value of A (=M/Si atomic ratio) and a value of B (=N/Si atomic ratio) were computed. From the A value, a value of C1, C2 or C3 corresponding to the right-hand side of formula (1), (2) or (3) was computed.

$$C1 = 0.68 \times A + 0.23$$

$$C2 = 1.19 \times A - 0.19$$

$$C3 = 2.12 \times A - 0.70$$

Figure 5:
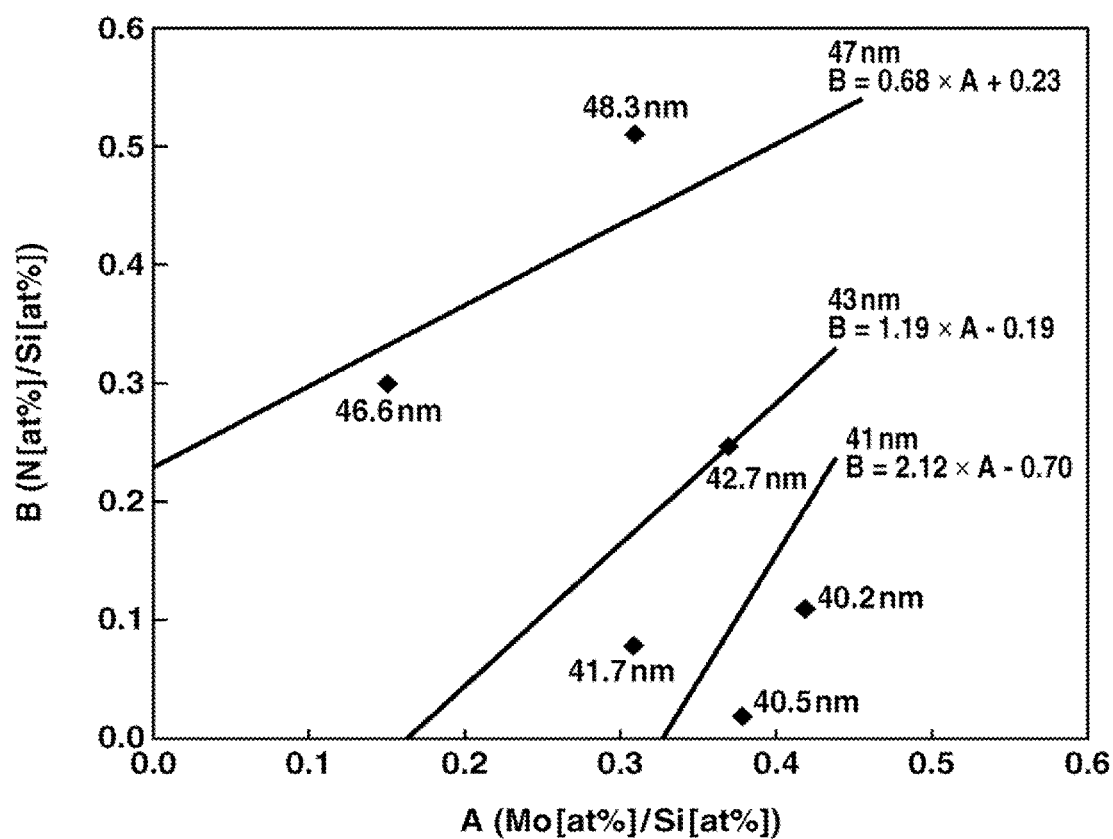
FIG. 5 is a diagram showing A value (M/Si), B value (N/Si), and thickness of films in Experiment 1.

The results are shown in Table 1 and FIG. 5.

TABLE 1

| Composition | Film thickness, nm (optical density 3.0) | A | B | C1 | C2 | C3 |
|---|---|---|---|---|---|---|
| 1 | 48.3 | 0.31 | 0.51 | 0.44 | 0.18 | −0.04 |
| 2 | 42.7 | 0.37 | 0.25 | 0.48 | 0.25 | 0.08 |
| 3 | 46.6 | 0.15 | 0.30 | 0.33 | −0.01 | −0.38 |
| 4 | 41.7 | 0.31 | 0.08 | 0.44 | 0.18 | −0.04 |
| 5 | 40.2 | 0.42 | 0.11 | 0.52 | 0.31 | 0.19 |
| 6 | 40.5 | 0.38 | 0.02 | 0.49 | 0.26 | 0.11 |

It is evident from these results that for light-shielding films composed mainly of Mo, Si and N and having an optical density of at least 3.0, the composition applicable to the light-shielding film having a thickness equal to or less than a predetermined thickness can be designed based on formulae (1) to (3).

Example 1

A MoSiN layer was deposited on a quartz substrate while continuously reducing the concentration of nitrogen gas. The resulting MoSiN layer was a compositionally graded layer of 43 nm thick having a composition of 20 at % Mo, 58 at % Si and 20 at % N (corresponding to A=0.34, B=0.34, C1=0.46) at a substrate adjacent side and a composition of 22 at % Mo, 62 at % Si and 15 at % N (corresponding to A=0.35, B=0.24, C1=0.47) at a remote side from the substrate. Subsequently a MoSiN layer of 4 nm thick was deposited under such conditions that this layer was composed of 7 at % Mo, 48 at % Si and 37 at % N (corresponding to A=0.15, B=0.77, C1=0.33). A light-shielding film of two layers was obtained.

The light-shielding film had a thickness of 47 nm. With respect to light of wavelength 193 nm, the film had an optical density OD of 3.05, a reflectance of 34% at its substrate adjacent side, and a reflectance of 32% at its remote side. Since a MSiN layer composed of transition metal M, silicon Si and nitrogen N and meeting formula (1) was formed adjacent the substrate, a light-shielding film having a thickness of 47 nm could be formed.

Next, a CrN film (Cr:N=9:1 in atomic ratio) having a thickness of 10 nm was deposited on the binary photomask blank by a sputtering technique. A resist material for EB lithography was coated thereon to form a resist film having a thickness of 150 nm. The resist film was exposed to EB and developed to form a line-and-space pattern (etch mask pattern) having a line width of 120 nm. The CrN film was patterned by dry etching using 185 sccm of $Cl_2$ gas, 55 sccm of $O_2$ gas, and 9.25 sccm of He gas as the etchant gas, for thereby transferring the resist pattern to the CrN film to form an etch mask pattern of CrN film. Through the etch mask pattern of CrN film, the light-shielding film was dry etched using 18 sccm of $SF_6$ gas and 45 sccm of $O_2$ gas as the etchant gas. Thereafter, the etch mask pattern of resist film and the etch mask pattern of CrN film were removed, yielding a photomask pattern of light-shielding film.

The cross-sectional profile of the photomask pattern of light-shielding film thus obtained was observed under SEM, confirming a fully perpendicular cross-section.

Example 2

Deposition was conducted on a quartz substrate under such conditions that a MoSiN layer composed of 20 at % Mo, 70 at % Si and 6 at % N (corresponding to A=0.29, B=0.09, C2=0.15) and having a thickness of 39 nm was formed adjacent the substrate. Subsequently a MoSiN layer of 4 nm thick was deposited under such conditions that this layer was composed of 6 at % Mo, 54 at % Si and 22 at % N (corresponding to A=0.11, B=0.41, C2=−0.06). A light-shielding film of two layers was obtained.

The light-shielding film had a thickness of 43 nm. With respect to light of wavelength 193 nm, the film had an optical density OD of 3.00, a reflectance of 51% at its substrate adjacent side, and a reflectance of 45% at its remote side. Since a MSiN layer composed of transition metal M, silicon Si and nitrogen N and meeting formula (2) was formed adjacent the substrate, a light-shielding film having a thickness of 43 nm or less could be formed.

Thereafter, as in Example 1, a photomask pattern of the light-shielding film was obtained. Its cross-sectional profile was observed under SEM, confirming a fully perpendicular cross-section.

Example 3

Deposition was conducted on a quartz substrate under such conditions that a MoSiN layer composed of 33 at % Mo, 65 at % Si and 2 at % N (corresponding to A=0.51, B=0.03, C3=0.38) and having a thickness of 40 nm was formed. A light-shielding film of single layer was obtained.

The light-shielding film had a thickness of 40 nm. With respect to light of wavelength 193 nm, the film had an optical density OD of 3.05, a reflectance of 55% at its substrate adjacent side, and a reflectance of 62% at its remote side. Since a MSiN layer composed of transition metal M, silicon Si and nitrogen N and meeting formula (3) was formed, a light-shielding film having a thickness of 41 nm or less could be formed.

Thereafter, as in Example 1, a photomask pattern of the light-shielding film was obtained. Its cross-sectional profile was observed under SEM, confirming a fully perpendicular cross-section.

Comparative Example 1

Deposition was conducted on a quartz substrate under such conditions that a MoSiN layer composed of 17 at % Mo, 55 at % Si and 28 at % N (corresponding to A=0.31, B=0.51, C1=0.44) and having a thickness of 48 nm was formed. A light-shielding film of single layer was obtained.

The light-shielding film had a thickness of 48 nm. With respect to light of wavelength 193 nm, the film had an optical density OD of 3.00, a reflectance of 32% at its substrate adjacent side, and a reflectance of 40% at its remote side. When the thickness of this MSiN film was reduced below 48 nm, the optical density OD dropped below 3.0. When a MSiN layer composed of transition metal M, silicon Si and nitrogen N did not meet formula (1), a light-shielding film having an optical density OD of at least 3.0 at a thickness of 47 nm or less could not be formed.

Japanese Patent Application Nos. 2014-145039 and 2015-104399 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A binary photomask blank comprising a transparent substrate and a light-shielding film thereon, the light-shielding film composed mainly of a transition metal M and silicon Si, or a transition metal M, silicon Si and nitrogen N, consisting of one or more layers, and having an optical density of at least 3.0, wherein said light-shielding film includes a layer of a transition metal-silicon-nitrogen composition meeting the formula (1):

$$B \leq 0.68 \times A + 0.23 \tag{1}$$

wherein A is an atomic ratio of M to Si and B is an atomic ratio of N to Si, and has a thickness of up to 47 nm.

2. A binary photomask blank comprising a transparent substrate and a light-shielding film thereon, the light-shielding film composed mainly of a transition metal M and silicon Si, or a transition metal M, silicon Si and nitrogen N, consisting of one or more layers, and having an optical density of at least 3.0, wherein said light-shielding film includes a layer of a transition metal-silicon-nitrogen composition meeting the formula (2):

$$B \leq 1.19 \times A - 0.19 \tag{2}$$

wherein A is an atomic ratio of M to Si and B is an atomic ratio of N to Si, and has a thickness of up to 43 nm.

3. A binary photomask blank comprising a transparent substrate and a light-shielding film thereon, the light-shielding film composed mainly of a transition metal M and silicon Si, or a transition metal M, silicon Si and nitrogen N, consisting of one or more layers, and having an optical density of at least 3.0, wherein said light-shielding film includes a layer of a transition metal-silicon-nitrogen composition meeting the formula (3):

$$B \leq 2.12 \times A - 0.70 \tag{3}$$

wherein A is an atomic ratio of M to Si and B is an atomic ratio of N to Si, and has a thickness of up to 41 nm.

4. The binary photomask blank of any one of claims 1 to 3 wherein the transition metal is molybdenum.

5. The binary photomask blank of any one of claims 1 to 3, further comprising a hard mask film on the light-shielding film, the hard mask film being formed of a material having etch resistance when the light-shielding film is etched.

6. The binary photomask blank of claim 5 wherein the transition metal is molybdenum and the hard mask film contains chromium.

7. A method for preparing a binary photomask comprising the steps of:

forming a resist film having a thickness of up to 150 nm on the light-shielding film of the binary photomask blank of any one of claims 1 to 3, processing the resist film to form an etch mask pattern thereof, processing the light-shielding film to form a photomask pattern thereof using the etch mask pattern of resist film, and removing the etch mask pattern of resist film.

8. A method for preparing a binary photomask comprising the steps of:

forming a resist film having a thickness of up to 150 nm on the hard mask film of the binary photomask blank of claim 5, processing the resist film to form an etch mask pattern thereof, processing the hard mask film to form an etch mask pattern thereof using the etch mask pattern of resist film, processing the light-shielding film to form a photomask pattern thereof using the etch mask pattern of hard mask film, and removing the etch mask pattern of resist film and the etch mask pattern of hard mask film.

9. A method for preparing a binary photomask comprising the steps of:

forming a resist film having a thickness of up to 150 nm on the hard mask film of the binary photomask blank of claim 6, processing the resist film to form an etch mask pattern thereof, processing the hard mask film to form an etch mask pattern thereof using the etch mask pattern of resist film, processing the light-shielding film to form a photomask pattern thereof using the etch mask pattern of hard mask film, and removing the etch mask pattern of resist film and the etch mask pattern of hard mask film.

10. A method for preparing a binary photomask blank comprising a transparent substrate and a light-shielding film thereon, the light-shielding film composed mainly of a transition metal M and silicon Si, or a transition metal M, silicon Si and nitrogen N, consisting of one or more layers, and having an optical density of at least 3.0, said method comprising the step of forming the light-shielding film such that it may include a layer of a transition metal-silicon-nitrogen composition meeting the formula (1):

$$B \leq 0.68 \times A + 0.23 \tag{1}$$

wherein A is an atomic ratio of M to Si and B is an atomic ratio of N to Si, and it may have a thickness of up to 47 nm.

11. A method for preparing a binary photomask blank comprising a transparent substrate and a light-shielding film thereon, the light-shielding film composed mainly of a transition metal M and silicon Si, or a transition metal M, silicon Si and nitrogen N, consisting of one or more layers, and having an optical density of at least 3.0, said method comprising the step of forming the light-shielding film such that it may include a layer of a transition metal-silicon-nitrogen composition meeting the formula (2):

$$B \leq 1.19 \times A - 0.19 \tag{2}$$

wherein A is an atomic ratio of M to Si and B is an atomic ratio of N to Si, and it may have a thickness of up to 43 nm.

12. A method for preparing a binary photomask blank comprising a transparent substrate and a light-shielding film thereon, the light-shielding film composed mainly of a transition metal M and silicon Si, or a transition metal M, silicon Si and nitrogen N, consisting of one or more layers, and having an optical density of at least 3.0, wherein said method comprising the step of forming the light-shielding film such that it may include a layer of a transition metal-silicon-nitrogen composition meeting the formula (3):

$$B \leq 2.12 \times A - 0.70 \tag{3}$$

wherein A is an atomic ratio of M to Si and B is an atomic ratio of N to Si, and it may have a thickness of up to 41 nm.

13. The method of any one of claims 10 to 12 wherein the transition metal is molybdenum.

\* \* \* \* \*